US012154922B2

(12) United States Patent
Byun (10) Patent No.: US 12,154,922 B2
(45) Date of Patent: Nov. 26, 2024

(54) IMAGE SENSING DEVICE

(71) Applicant: SK hynix Inc., Icheon-si (KR)

(72) Inventor: Kyung Su Byun, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 558 days.

(21) Appl. No.: 17/499,695

(22) Filed: Oct. 12, 2021

(65) Prior Publication Data

US 2022/0181371 A1 Jun. 9, 2022

(30) Foreign Application Priority Data

Dec. 8, 2020 (KR) ........................ 10-2020-0170452

(51) Int. Cl.
*H01L 27/146* (2006.01)
(52) U.S. Cl.
CPC .. *H01L 27/14627* (2013.01); *H01L 27/14621* (2013.01); *H01L 27/14636* (2013.01)
(58) Field of Classification Search
CPC .. H04N 25/70; H04N 25/76; H01L 27/14627; H01L 27/14621; H01L 27/14636; H01L 27/14605; H01L 27/14634
See application file for complete search history.

(56) References Cited

U.S. PATENT DOCUMENTS

| | | | |
|---|---|---|---|
| 7,291,826 B2 | 11/2007 | Vaillant | |
| 9,159,761 B2 | 10/2015 | Kokubun | |
| 9,184,198 B1 * | 11/2015 | Miao | H01L 27/14621 |
| 9,337,232 B2 | 5/2016 | Lee | |
| 2005/0280882 A1 | 12/2005 | Nakano | |
| 2012/0081587 A1 | 4/2012 | Ryu | |
| 2012/0273683 A1 | 11/2012 | Saito | |
| 2017/0278887 A1 | 9/2017 | Han et al. | |

(Continued)

FOREIGN PATENT DOCUMENTS

| | | |
|---|---|---|
| CN | 109786403 A | 5/2019 |
| CN | 111627940 A | 9/2020 |

(Continued)

OTHER PUBLICATIONS

Notification to Grant Patent Right for Invention for CN Patent Application No. 202111180049.6, mailed on May 29, 2024, 6 pages with translation.

*Primary Examiner* — Kelly L Jerabek
(74) *Attorney, Agent, or Firm* — Perkins Coie LLP (57) ABSTRACT

Image sensing devices are disclosed. In some implementations, an image sensing device may include a first sensor layer structured to include a plurality of first photoelectric conversion elements to receive light rays and generate photocharge corresponding to the light rays, a second sensor layer disposed below the first sensor layer, the second sensor layer structured to include a plurality of second photoelectric conversion element vertically overlapping the first photoelectric conversion elements to receive light rays and generate photocharge corresponding to the light rays having passed through the first sensor layer, and a bonding layer disposed between the first and second sensor layers, wherein the bonding layer comprises a lens layer structured to refract light rays having passed through the first sensor layer toward the second sensor layer such that an angle of incidence of the light rays is larger than a refraction angle of the light rays.

16 Claims, 8 Drawing Sheets

(56) References Cited

U.S. PATENT DOCUMENTS

| | | | | |
|---|---|---|---|---|
| 2018/0013961 A1* | 1/2018 | Lee | .................... | H04N 25/62 |
| 2019/0296069 A1* | 9/2019 | Yang | ................ | H01L 27/14623 |
| 2021/0250480 A1* | 8/2021 | Lee | .................. | H01L 27/14607 |
| 2022/0045117 A1* | 2/2022 | Huang | .............. | H01L 31/02325 |

FOREIGN PATENT DOCUMENTS

| | | |
|---|---|---|
| CN | 109309103 B | 11/2023 |
| JP | 2012169528 A | 9/2012 |
| JP | 2013219180 A | 10/2013 |

* cited by examiner

IMAGE SENSING DEVICE

CROSS-REFERENCES TO RELATED APPLICATION

The present application claims the priority and benefits of Korean application number 10-2020-0170452, filed on Dec. 8, 2020, which is incorporated herein by reference in its entirety.

TECHNICAL FIELD

Various embodiments generally relate to an image sensing device including a photoelectric conversion element implemented in a stacked type.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IOT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

The embodiments of the disclosed technology relate to an image sensing device having an optimized stack structure.

In some embodiments of the disclosed technology, an image sensing device has two or more image sensor layers stacked on top of one another and one or more bonding layers arranged between two or more image sensor layers. The one or more bonding layers may include one or more lenses structured to correct or adjust light path from one image sensor layer to another image sensor layer.

In an embodiment, an image sensing device may include: a first sensor layer structured to include a plurality of first photoelectric conversion elements to receive light rays and generate photocharge corresponding to the light rays; a second sensor layer disposed below the first sensor layer, the second sensor layer structured to include a plurality of second photoelectric conversion element vertically overlapping the first photoelectric conversion elements to receive light rays and generate photocharge corresponding to the light rays having passed through the first sensor layer; and a bonding layer disposed between the first and second sensor layers, wherein the bonding layer comprises a lens layer structured to refract light rays having passed through the first sensor layer toward the second sensor layer such that an angle of incidence of the light rays is larger than a refraction angle of the light rays.

In an embodiment, an image sensing device may include: a plurality of first photoelectric conversion elements structured to respond to incident light, each first photoelectric conversion element structured to convert the incident light into a first electrical signal; a plurality of second photoelectric conversion elements disposed under the plurality of first photoelectric conversion elements vertically overlapping the plurality of first photoelectric conversion elements, each second photoelectric conversion element structured to convert the incident light that passes through a first sensor layer into a second electrical signal; and a lens layer disposed under the plurality of first photoelectric conversion elements and over the plurality of second photoelectric conversion elements, wherein the lens layer comprises a first slit having a first width, a second slit having a second width narrower than the first width, and a dielectric layer structured to surround the first and second slits, and the first slit is disposed at a position where a chief ray incident on the lens layer reaches.

In an embodiment, an image sensing device may include: a first sensor layer including a first photoelectric conversion element configured to generate photocharge corresponding to the intensity of light; a second sensor layer including a second photoelectric conversion element vertically overlapping the first photoelectric conversion element, and configured to generate photocharge corresponding to the intensity of light having passed through the first sensor layer; and a bonding layer disposed between the first and second sensor layers. The bonding layer may include a digital lens configured to refract light having passed through the first sensor layer, such that an incident angle of the light is larger than a refraction angle of the light.

In an embodiment, an image sensing device may include: a first photoelectric conversion element configured to generate photocharge corresponding to the intensity of light; a second photoelectric conversion element vertically overlapping the first photoelectric conversion element, and configured to generate photocharge corresponding to the intensity of light having passed through the first sensor layer; and a digital lens disposed between the first and second photoelectric conversion elements, wherein the digital lens includes a first slit having a relatively large width, a second slit having a relatively small width, and a dielectric layer disposed between the first and second slits, and the first slit is disposed at a position which a chief ray incident on the digital lens reaches.

In an embodiment, an image sensing device may include: a substrate; a first sensor layer supported by the substrate and structured to include a plurality of first photoelectric conversion elements to receive light rays and generate photocharge corresponding to the light rays; a second sensor layer supported by the substrate and disposed below the first sensor layer, the second sensor layer structured to include a plurality of second photoelectric conversion element vertically overlapping the first photoelectric conversion elements to receive light rays and generate photocharge corresponding to the light rays having passed through the first sensor layer; and a bonding layer disposed in the substrate between the first and second sensor layers, wherein the bonding layer comprises a lens layer structured to refract light rays having passed through the first sensor layer toward the second sensor layer such that an angle of incidence of the light rays is larger than a refraction angle of the light rays.

In an embodiment, an image sensing device may include: a substrate; a plurality of first photoelectric conversion elements supported by the substrate and structured to respond to incident light, each first photoelectric conversion element structured to convert the incident light into a first electrical signal; a plurality of second photoelectric conversion elements supported by the substrate and disposed under the plurality of first photoelectric conversion elements vertically overlapping the plurality of first photoelectric conversion elements, each second photoelectric conversion element structured to convert the incident light that passes through the first sensor layer into a second electrical signal; and a lens layer disposed in the substrate under the plurality of first photoelectric conversion elements and over the plurality of second photoelectric conversion elements, wherein the lens layer comprises a first slit having a first width, a second slit having a second width narrower than the first width, and a dielectric layer structured to surround the first and second slits, and the first slit is disposed at a position where a chief ray incident on the lens layer reaches.

In some embodiments, the digital lens may be inserted between the photoelectric conversion elements that are vertically stacked, and calibrate the optical path, thereby preventing optical crosstalk.

In addition, it is possible to provide various effects which are directly or indirectly understood through this document.

DETAILED DESCRIPTION

Hereafter, various embodiments of the present disclosure will be described with reference to the accompanying drawings. However, it should be noted that the present disclosure is not limited to specific embodiments, but includes various modifications, equivalents and/or alternatives.

Figure 1:
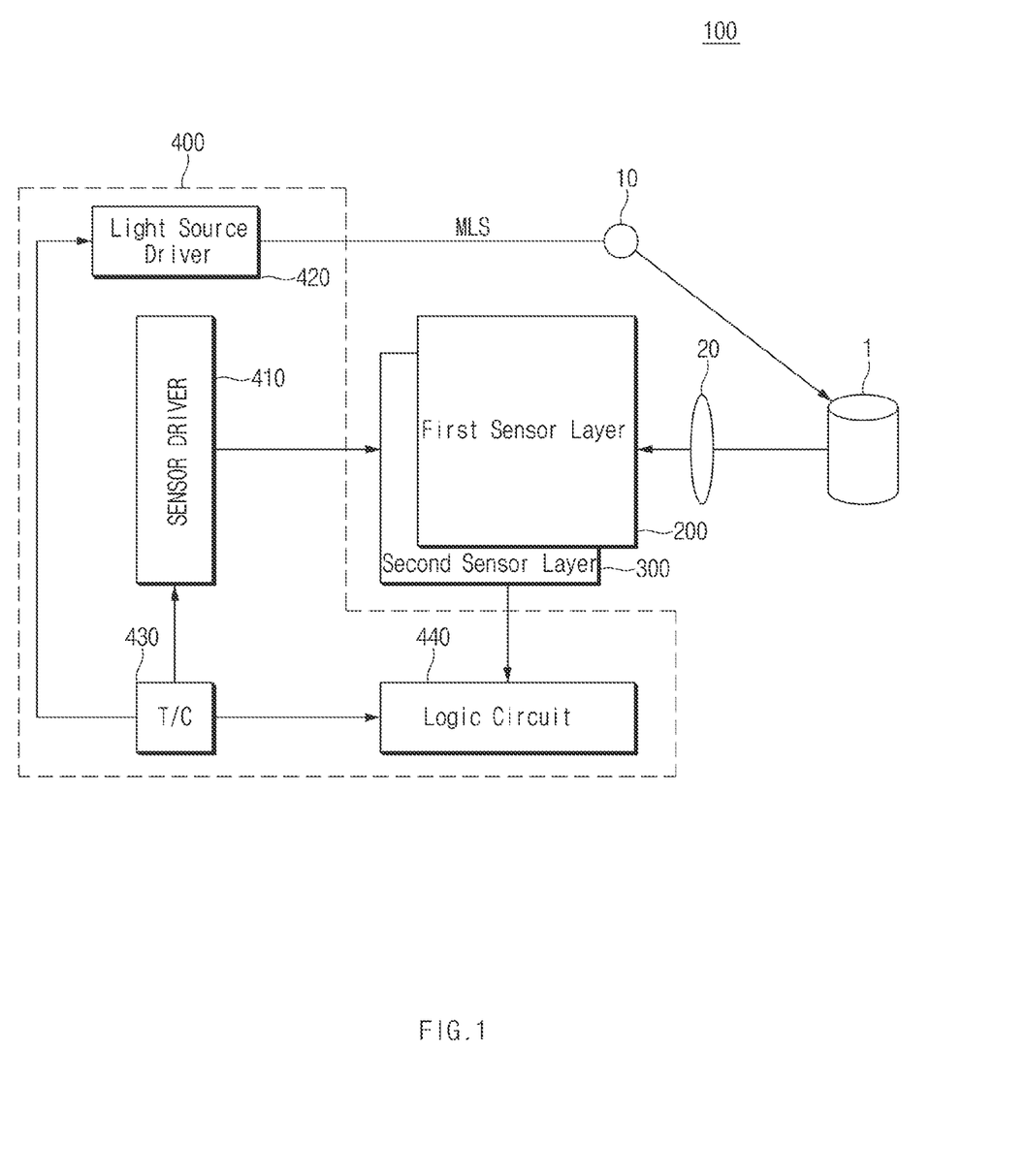
FIG. 1 is a diagram schematically illustrating an example configuration of an image sensing device based on an embodiment of the disclosed technology.

FIG. 1 is a diagram schematically illustrating an example configuration of an image sensing device based on an embodiment of the disclosed technology.

Referring to FIG. 1, an image sensing device 100 is a CMOS (Complementary Metal-Oxide-Semiconductor) image sensing device, and may include a light source 10, a lens module 20, a first sensor layer 200, a second sensor layer 300 and a logic layer 400.

Depth sensors are used to measure a distance between image sensing device and an object. The depth sensors may require an extra space in the electronic device, bringing restrictions to the design of the image sensing device.

The first and second sensor layers 200 and 300 may acquire the same type of images or different types of images, respectively. In some implementations, the first sensor layer 200 may be used to acquire a color image corresponding to a specific color (e.g., R (Red), G (Green) or B (Blue)), and the second sensor layer 300 may be used to acquire a depth image for measuring the distance between the image sensing device and a target object 1 through a ToF (Time of Flight) method. In some implementations, the image sensing device 100 acquires a color image and a depth image. In some implementations, the depth image may include an image or optical signal captured by an image sensor to measure a distance between image sensing device and an object.

In an implementation, the image sensing device 100 may acquire a color image and an IR (Infrared-Ray) image concurrently. In another implementation, the image sensing device 100 may acquire a pair of color images corresponding to different sensitivities. In this case, the image sensing device 100 may not include some of the components other image sensing device can have, such as the light source 10 and a light source driver 420 of the logic layer 400.

The light source 10 emits light toward the target object 1 in response to a modulation light signal MLS from the logic layer 400. Examples of the light source 10 may include an laser diode (LD) or a light emitting diode (LED), an NIR (Near Infrared Laser), a point light source, a monochromatic illumination source and a combination of these light sources and/or other laser sources. The LD or the LED emits light at a specific wavelength band (e.g., near-infrared ray, infrared ray or visible light), and the monochromatic illumination source include a white lamp and a monochromator. For example, the light source 10 may emit infrared light having a wavelength of 800 nm to 1,000 nm. The light generated by the light source 10 may include light modulated at a preset frequency. FIG. 1 illustrates only one light source 10 for convenience of description, but a plurality of light sources may be arranged around the lens module 20.

The lens module 20 may collect light reflected from the target object 1 and transfer the collected light to the sensor layers 200 and 300. The light reflected from the target object 1 may include infrared light that is generated by the light source 10 and reflected by the target object 1, and visible light that is generated by an external light source (e.g., sunlight or illumination) and reflected by the target object 1. Light reflected from the target object 1 (e.g., an object or a scene) is transmitted through the lens module 20. For example, the lens module 20 may include a focusing lens having a glass or plastic surface or a cylindrical optical element. The lens module 20 may include a plurality of lenses aligned with an optical axis.

The first sensor layer 200 may include a plurality of color pixels for capturing images with colors arranged in rows and columns in a 2D matrix array. The plurality of color pixels are adjacent image sensing pixels with different color filters that are arranged to capture color information. For example, the color filters may be arranged based on a Bayer filter pattern with green, red and blue filters with 50% green, 25% red and 25% blue. The image sensing pixels may be formed in a semiconductor substrate, and may be used to convert light transmitted through the lens module 20 and the color filters into electrical signals corresponding to the intensity of light at a wavelength corresponding to a specific color filter, and output the electrical signals as image sensing pixel signals.

The second sensor layer 300 may include a plurality of depth pixels arranged in rows and columns in a 2D matrix array. The depth pixels may be formed in the semiconductor substrate, and may be used to convert light transmitted through the lens module 20 into electrical signals corresponding to the intensity of light at infrared wavelengths, and output the electrical signals as depth pixel signals. In some implementations, the depth pixel signals may be used to measure a distance between image sensing device and an object.

Each of the image sensing pixels and each of the depth pixels may include a photoelectric conversion element to generate photocharges corresponding to the intensity of incident light and one or more transistors configured to generate an electrical signal based on the photocharges. For example, each of the image sensing pixels may have a 3-TR (transistor) structure, 4-TR structure or 5-TR structure. In some implementations, each of the depth pixels may include an SPAD (Single Photon Avalanche Diode) pixel to be operated based on a direct ToF method. In some implementations, each of the depth pixels may be a CAPD (Current Assisted Photonics Demodulation) pixel that can be operated based on an indirect ToF method.

The resolution of the image sensing pixels may be equal to or different from the resolution of the depth pixels. In some implementations, the resolution of the depth pixels may be smaller than the resolution of the image sensing pixels. In some implementations, the first and second sensor layers 200 and 300 have the same resolution, and the image sensing pixels are mapped to the depth pixels, respectively.

The logic layer 400 may include circuitry that can control the light source 10 to transmit light toward the target object 1, activate the pixels of the first and second sensor layers 200 and 300, and generate a color image and depth image for the target object 1 by processing an image sensing pixel signal and depth pixel signal corresponding to light reflected from the target object 1. The color image may be an image indicating the color of the target object 1, and the depth image may be an image indicating the distance to the target object 1.

The logic layer 400 may include a sensor driver 410, a light source driver 420, a timing controller (T/C) 430 and a logic circuit 440.

The sensor driver 410 may activate and/or control the image sensing pixels of the first sensor layer 200 and the depth pixels of the second sensor layer 300 in response to a timing signal generated by the timing controller 430. For example, the sensor driver 410 may generate a control signal to select and control one or more row lines among a plurality of row lines of each of the first and second sensor layers 200 and 300. Such a control signal may include a reset signal for controlling a reset transistor, a transmission signal for controlling a transmission transistor, a selection signal for controlling a selection transistor, and the like. In some implementations, when the second sensor layer 300 includes pixels that are operated based on the indirect ToF method, the control signal may further include a demodulation control signal having a specific phase difference (e.g., 0, 90, 180 or 270 degrees) from the modulation light signal MLS.

The light source driver 420 may generate the modulation light signal MLS to control the light source 10 based on commands or control signals generated by the timing controller 430. The modulation light signal MLS may include a signal modulated at a preset frequency.

The timing controller 430 may generate a timing signal for controlling the operations of the sensor driver 410, the light source driver 420 and the logic circuit 440.

The logic circuit 440 may generate digital pixel data by processing analog pixel signals generated by the first and second sensor layers 200 and 300 based on commands or control signals generated by the timing controller 430. In some implementations, the logic circuit 440 may include a CDS (Correlated Double Sampler) configured to perform correlated double sampling on the pixel signals outputted from the first and second sensor layers 200 and 300. The logic circuit 440 may include an ADC (Analog-Digital Converter) configured to convert analog output signals from the CDS into digital signals. In some implementations, the logic circuit 440 may include a buffer circuit configured to temporarily store pixel data outputted from the ADC and output the pixel data based on commands or control signals generated by the timing controller 430.

In some implementations, the logic circuit 440 may generate a color image based on the light rays captured by the first sensor layer 200 and a depth image based on the light rays captured by the second sensor layer 300. In some implementations, an image signal processor (not illustrated) provided in addition to the logic circuit 440 or the image sensing device 100 may generate a 3D image by synthesizing the color image and the depth image, or determine the distance between the second sensor layer 300 and the target object 1 based on the depth image.

By way of example of the method for calculating the distance to the target object 1, the indirect ToF method will be discussed below. The light source 10 may generate light rays that are modulated at the preset frequency, toward a target object. The image sensing device 100 may generate a depth image of the depth pixels by sensing the modulated light rays reflected from the target objects 1. In some implementations, a time delay that occurs between the modulated light and the incident light is used to determine the distance between the image sensing device 100 and the target object 1. Such a time delay results in a phase difference between a signal generated by the image sensing device 100 and the modulation light signal MLS for controlling the light source 10. The image signal processor (not illustrated) may calculate depth information for each depth pixel by calculating the phase difference with respect to the depth image outputted from the image sensing device 100.

Figure 2:
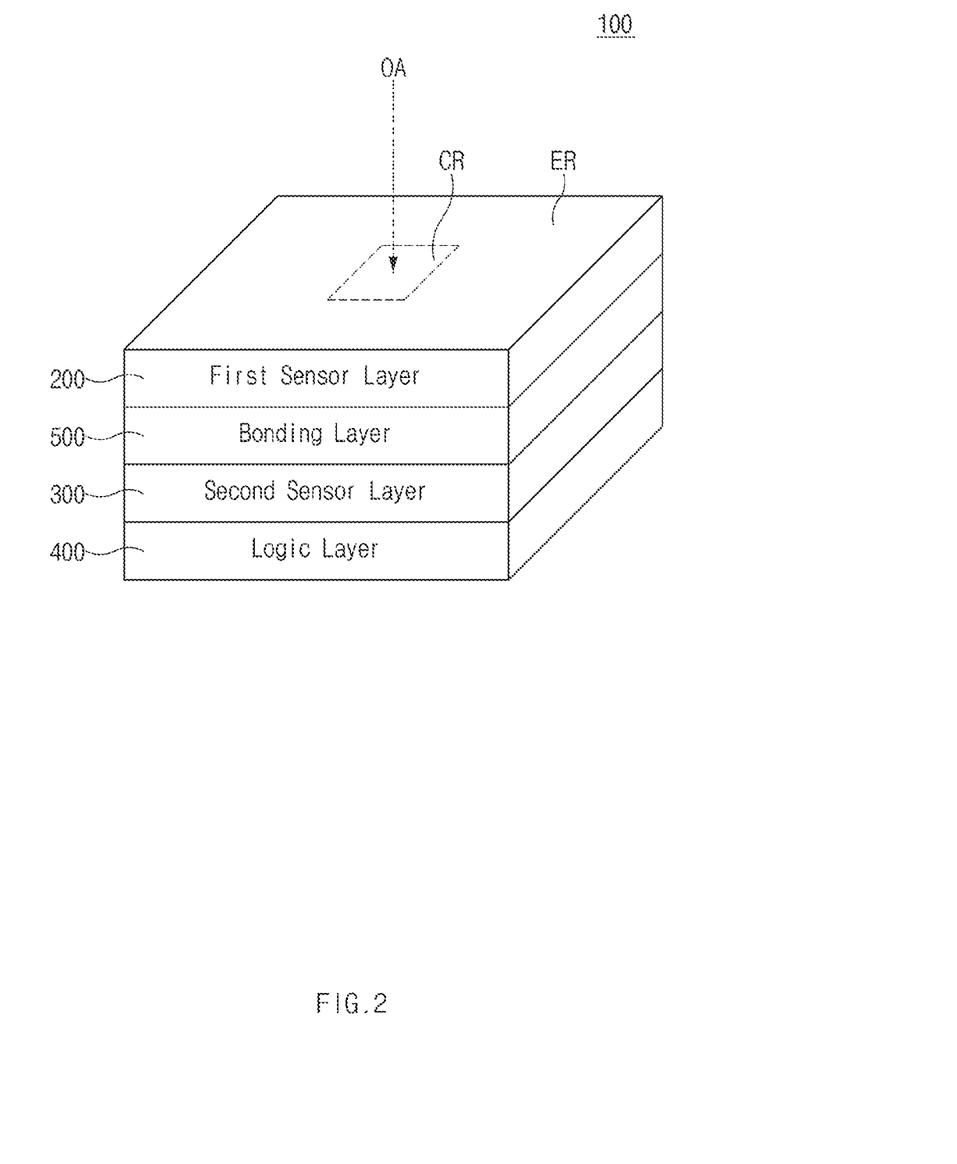
FIG. 2 is a diagram illustrating an example of a stacked structure of a first sensor layer, a second sensor layer and a logic layer illustrated in FIG. 1.

FIG. 2 is a diagram illustrating an example of a stacked structure of the first sensor layer, the second sensor layer and the logic layer illustrated in FIG. 1.

Referring to FIG. 2, the first sensor layer 200, the second sensor layer 300 and the logic layer 400 of the image sensing device 100 illustrated in FIG. 1 may be stacked on top of one another and aligned with the optical axis OA of the lens module 20.

In some implementations, a bonding layer 500 may be disposed between the first sensor layer 200 and the second sensor layer 300 to bond the first and second sensor layers 200 and 300 and to transfer signals to the logic layer 400. In some implementations, the first sensor layer 200, the bonding layer 500, the second sensor layer 300 and the logic layer 400 may be sequentially arranged in the direction away from the lens module 20. Although FIG. 2 illustrates the first sensor layer 200, the bonding layer 500, the second sensor layer 300 and the logic layer 400 as having the same cross sectional area, the disclosed technology is not limited thereto.

The cross-sectional region of the first sensor layer 200, the bonding layer 500, the second sensor layer 300 and the logic layer 400, which are stacked on top of one another, may be divided into a center region CR and an edge region ER, as shown in FIG. 2.

The center region CR, through which the optical axis OA passes, may include pixels corresponding to a predetermined number of rows and columns. FIG. 2 illustrates that the center region CR is formed in a rectangular shape, but the disclosed technology is not limited thereto. For example, the center region CR may have a cross-sectional shape corresponding to the shape of the lens module 20.

The edge region ER, which surrounds the center region CR, may include pixels.

Figure 3:
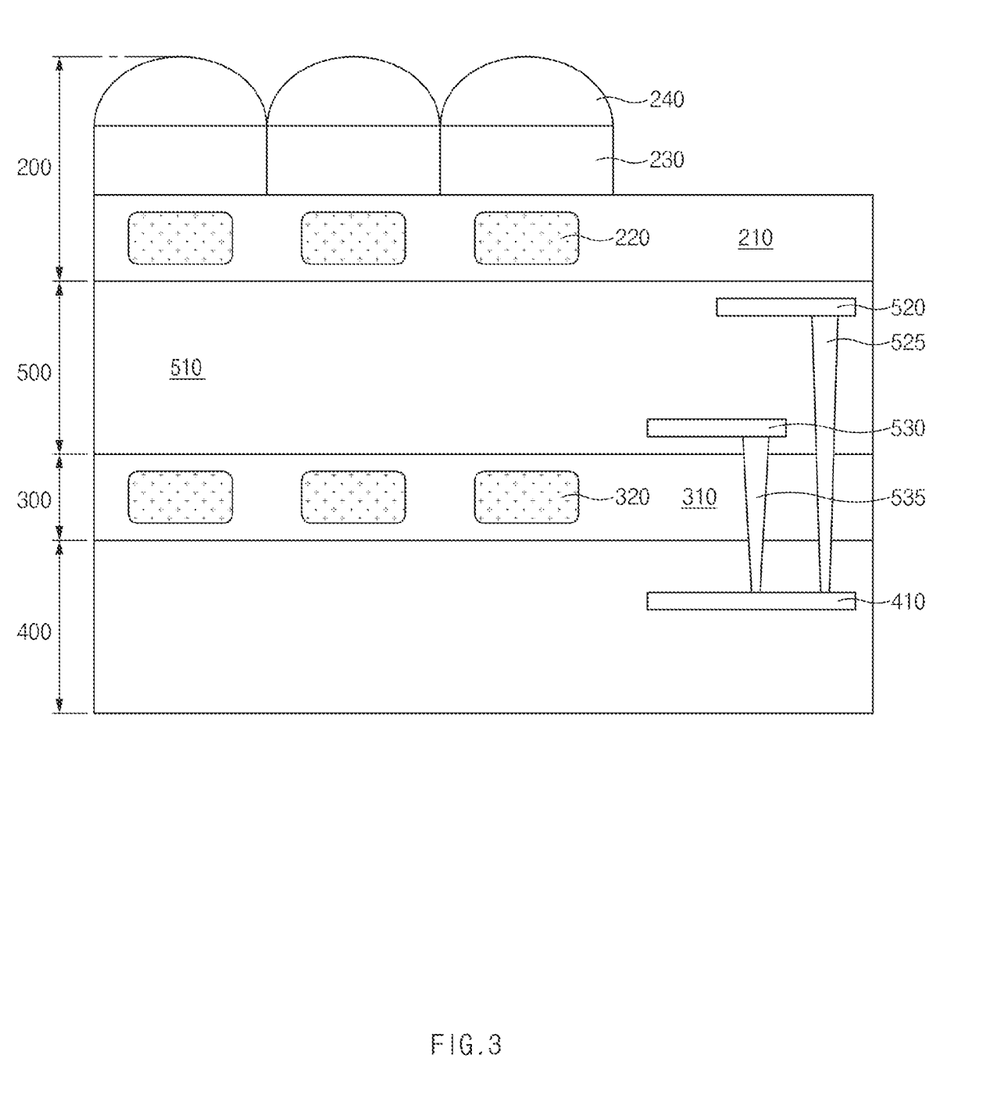
FIG. 3 is a cross-sectional view of the stacked structure illustrated in FIG. 2.

FIG. 3 is a cross-sectional view of the stacked structure illustrated in FIG. 2.

FIG. 3 illustrates the cross-section of the stacked structure of the first sensor layer 200, the bonding layer 500, the second sensor layer 300 and the logic layer 400, which are illustrated in FIG. 2, with respect to three pixels only by way of example.

The first sensor layer 200, the bonding layer 500, the second sensor layer 300 and the logic layer 400 are stacked in the sequence as illustrated in FIG. 3.

The first sensor layer 200 may include a first substrate 210, a first photoelectric conversion element 220, an optical filter 230 and a microlens 240.

The first substrate 210 may include top and bottom surfaces facing away from each other. In one example, the first substrate 210 may be a P-type or N-type bulk substrate. In another example, the first substrate 210 may be a substrate formed through an epitaxial growth of a P-type or N-type epitaxial layer on a P-type bulk substrate. In another example, the first substrate 210 may be a substrate formed through an epitaxial growth of a P-type or N-type epitaxial layer on an N-type bulk substrate.

The first photoelectric conversion element 220 may be disposed at a region within the first substrate 210, corresponding to each image sensing pixel. The first photoelectric conversion element 220 may generate photocharges corresponding to the intensity of light at a specific visible light wavelength band. The first photoelectric conversion element 220 may have a large light receiving area to improve efficiency by having a large fill-factor. Examples of the first photoelectric conversion element 220 may include a photodiode, a phototransistor, a photogate, a pinned photoelectric conversion element or combinations thereof.

When the first photoelectric conversion element 220 is implemented as a photodiode, the first photoelectric conversion element 220 may be formed as an N-type doping region by implanting N-type ions through an ion implantation process. In an embodiment, the photo diode may have a structure in which two or more doping regions are stacked. In this case, a lower doping region may be formed by implanting P ions and N+ ions, and an upper doping region may be formed by implanting N− ions.

The optical filter 230 may be formed over the first substrate 210, and selectively transmit light at a specific wavelength band corresponding to the visible light wavelength band (e.g., red, green or blue light). In some implementations, the optical filter 230 may include a color filter without an infrared cut-off filter. Thus, light having passed through the optical filter 230 may include light rays at a specific visible light wavelength band and an infrared light wavelength band, corresponding to the optical filter 230. The infrared light has a larger wavelength than the visible light, and thus can penetrate through a thicker material layer than the visible light. Therefore, even when the visible light having passed through the optical filter 230 is absorbed by the first photoelectric conversion element 220, the infrared light having passed through the optical filter 230 may reach the bonding layer 500 after passing through the first photoelectric conversion element 220.

The microlens 240 may be formed in a hemispherical shape over the optical filter 230 to improve the light receiving efficiency by increasing the light gathering power of the microlens 240. In some implementations, the microlens 240 may additionally include an over-coating layer (not illustrated) formed at the top or bottom thereof to avoid lens flare by preventing diffused reflection of light.

Although not illustrated in FIG. 3, a source and drain may be formed in an internal region of the first substrate 210 that is adjacent to the bottom surface of the first substrate 210. The source and drain may constitute each of a plurality of transistors for generating pixel signals based on photocharges that are accumulated in the first photoelectric conversion element 220. The plurality of transistors may be provided for each pixel or each pixel group of four pixels, for example. In an embodiment, each of the source and drain may include an impurity region doped with P-type or N-type impurities.

Pixel gates (not illustrated) constituting the transistor with the source and drain included in the first substrate 210 may be formed in an internal region of the bonding layer 500 adjacent to the bottom surface of the first substrate 210. The pixel gates may generate image sensing pixel signals by operating based on a control signal, such that each image sensing pixel can generate an image sensing pixel signal corresponding to the photocharges generated by the first photoelectric conversion element 220. For example, the pixel gates may include reset gates constituting a reset transistor, transmission gates constituting a transmission transistor, and selection gates constituting a selection transistor. Each of the pixel gates may include a gate dielectric layer for electrical isolation from the first substrate 210 and a gate electrode configured to receive the control signal.

The second sensor layer 300 may include a second substrate 310 and a second photoelectric conversion element 320.

In some implementations, the second substrate 310 and the second photoelectric conversion element 320 have the same functions as those of the first substrate 210 and the first photoelectric conversion element 220 of the first sensor layer 200 and are fabricated in the same manner as the first substrate 210 and the first photoelectric conversion element 220.

In some implementations, the second photoelectric conversion element 320 may generate photocharges corresponding to the intensity of incident light that reaches the second photoelectric conversion element 320 after passing through the bonding layer 500 without being absorbed (or photoelectrically converted) by the first photoelectric conversion element 220. In some implementations, the first photoelectric conversion element 220 and the second photoelectric conversion element 320 may vertically overlap each other.

In an embodiment, an isolation layer may be formed between the first photoelectric conversion elements 220 adjacent to each other and/or the second photoelectric conversion elements 320 adjacent to each other. The isolation layer may have a DTI (Deep Trench Isolation) structure. In some implementations, the isolation layer may be formed by etching the substrate on the left and right sides of the photoelectric conversion element 220 or 320 in a vertical direction through a deep-trench process to form trenches and gap-filling the trenches with a dielectric material having a different refractive index (e.g., a relatively high refractive index) from the corresponding substrate 210 or 310.

Although not illustrated in FIG. 3, a source and drain may be formed in an internal region of the second substrate 310 that is adjacent to the top surface of the second substrate 310. The source and drain may constitute each of a plurality of transistors for generating pixel signals based on photocharges that are accumulated in the second photoelectric conversion element 320. The plurality of transistors may be provided for each pixel or each pixel group of four pixels, for example. In an embodiment, each of the source and drain may include an impurity region doped with P-type or N-type impurities.

Pixel gates (not illustrated) constituting the transistor with the source and drain included in the second substrate 310 may be formed in an internal region of the bonding layer 500, adjacent to the top surface of the second substrate 310. The pixel gates may generate a depth pixel signal by operating based on the control signal, such that each depth pixel can generate a depth pixel signal corresponding to the photocharges generated by the second photoelectric conversion element 320. For example, the pixel gates may include reset gates constituting a reset transistor, transmission gates constituting a transmission transistor, and selection gates constituting a selection transistor. Each of the pixel gates may include a gate dielectric layer for electrical isolation from the second substrate 310 and a gate electrode configured to receive the control signal.

The bonding layer 500 may be disposed between the first and second sensor layers 200 and 300 to bond the first and second sensor layers 200 and 300 to each other. The bonding layer 500 may include a interconnect region 510, a first TSV (Through Silicon Via) pad 520 and a second TSV pad 530.

The interconnect region 510 may include a plurality of interconnect layers (e.g., Ma to Md of FIG. 5), and pixel gates and metal interconnects may be disposed in the plurality of interconnect layers.

The pixel gates may be configured in the same manner as those described above with respect to the first and second sensor layers 200 and 300.

Metal interconnects (540 of FIG. 5, for example) may transfer a control signal from the first or second TSV pad 520 or 530 to the pixel gates, and transfer an image sensing pixel signal or depth pixel signal, generated by operations of the pixel gates, to the first or second TSV pad 520 or 530.

In some implementations, no or less metal interconnects may be disposed in a region corresponding to the bottom of the first photoelectric conversion element 220 (or the top of the second photoelectric conversion element 320) such that light having passed through the first sensor layer 200 can be effectively transmitted to the second sensor layer 300.

The first TSV pad 520 may be disposed at the uppermost layer (e.g., Md of FIG. 5) among the plurality of interconnect layers, and electrically coupled to the metal interconnects and a first TSV 525 and transfer an electrical signal (e.g., a control signal or image sensing pixel signal). The first TSV pad 520 may have a larger horizontal area than the first TSV 525. The first TSV pad 520 may be disposed in the edge region where no image sensing pixels are disposed.

The second TSV pad 530 may be disposed at the lowermost layer (e.g., Ma of FIG. 5) among the plurality of interconnect layers, and may be electrically coupled to the metal interconnects and a second TSV 535 to carry an electrical signal (e.g., a control signal or a depth pixel signal). The second TSV pad 530 may have a larger horizontal area than the second TSV 535. The second TSV pad 530 may be disposed in the edge region where no pixels are disposed.

As described with reference to FIG. 1, the logic layer 400 may perform a series of operations for generating a color image and a depth image. The logic layer 400 may include a third TSV pad 410.

The third TSV pad 410 may be electrically coupled to the first and second TSVs 525 and 535 and logic circuits inside the logic layer 400, and may be used to transmit electrical signals (e.g., a control signal, an image sensing pixel signal and a depth pixel signal). The third TSV pad 410 may have a larger horizontal area than the first and second TSVs 525 and 535. The third TSV pad 410 may be disposed so that at least a part thereof vertically overlaps the first TSV pad 520 corresponding to the first sensor layer 200 and the second TSV pad 530 corresponding to the second sensor layer 300.

The TSV pads 520, 530 and 410 and the metal interconnects of the interconnect region 510 may include silver (Ag), copper (Cu), aluminum (Al) or other materials that have electrical conductivity. The TSV pads 520 and 410 may be electrically coupled through the first TSV 525, and the TSV pads 530 and 410 may be electrically coupled through the second TSV 535.

The first and second TSVs 525 and 535 may be electrically connected to the corresponding TSV pads vertically through at least parts of the bonding layer 500, the second sensor layer 300 and the logic layer 400.

In some implementations, each of the first and second TSVs 525 and 535 may have a dual structure including an internal plug for electrical coupling and a barrier surrounding the internal plug to electrically isolate the internal plug. The internal plug may include Ag, Cu, Al or the like, which has high electrical conductivity. The barrier may include titanium (Ti), titanium nitride (TiN), tantalum (Ta), tantalum nitride (TaN) or at least one of other barrier metals.

Figure 4:
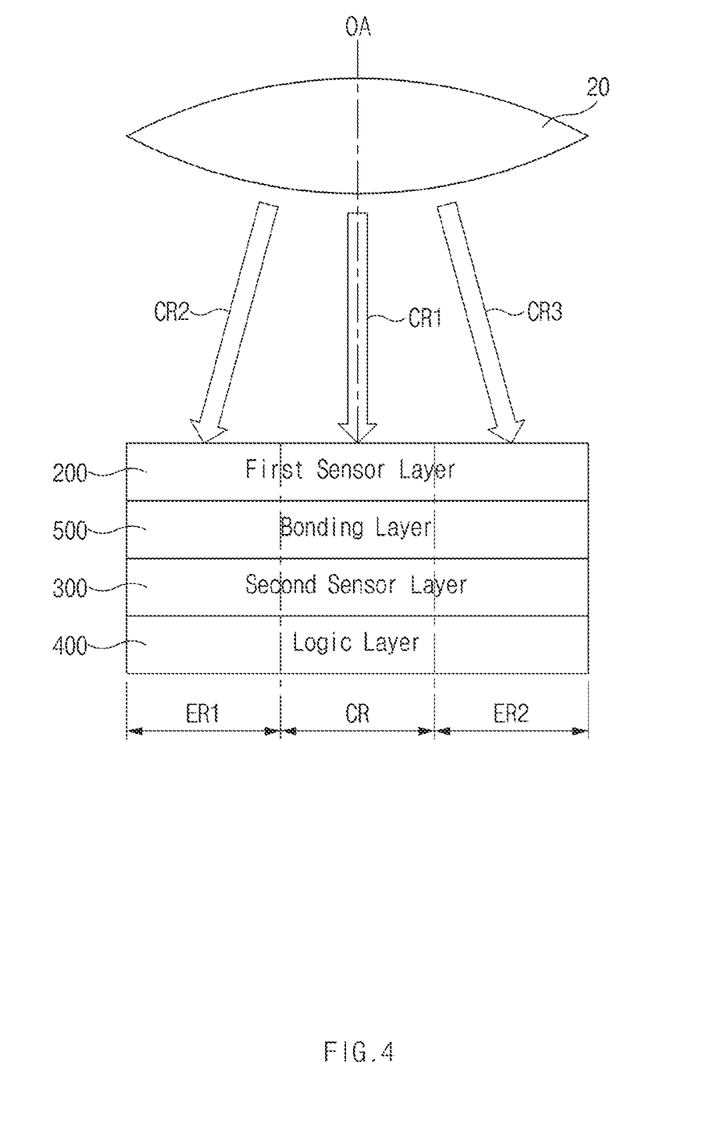
FIG. 4 is a diagram illustrating an example of light rays that propagate toward the first sensor layer through a lens module.

FIG. 4 is a diagram illustrating an example of light rays that propagate toward the first sensor layer through the lens module.

FIG. 4 illustrates a cross-section of the image sensing device 100 of FIG. 2. The image sensing device 100 may be divided into a center region CR including the optical axis OA, a first edge region ER1 disposed on one side (i.e., left side) of the center region CR, and a second edge region ER2 disposed on the other side (i.e., right side) of the center region CR. The first and second edge regions ER1 and ER2 may be included in the edge region ER of FIG. 2.

A chief ray CR1 incident on the center region CR through the lens module 20 may be vertically incident on the top surface of the first sensor layer 200. That is, the angle of incidence of the chief ray incident on the center region CR may be 0 degree or an angle approximate to 0 degree.

However, the chief ray incident on the first and second edge regions ER1 and ER2 may be incident obliquely on the top surface of the first sensor layer 200. That is, the angle of incidence of a chief ray CR2 incident on the first edge region ER1 and the angle of incidence of a chief ray CR3 incident on the second edge region ER2 may correspond to a predetermined angle ranging from 0 to 90 degrees. The predetermined angle may be changed depending on the size of the first sensor layer 200, the curvature of the lens module 20, the distance between the lens module 20 and the first sensor layer 200 or the like.

The angles of incidence of the chief rays CR1 to CR3 may gradually increase from the optical axis OA toward both ends of the first sensor layer 200.

Figure 5:
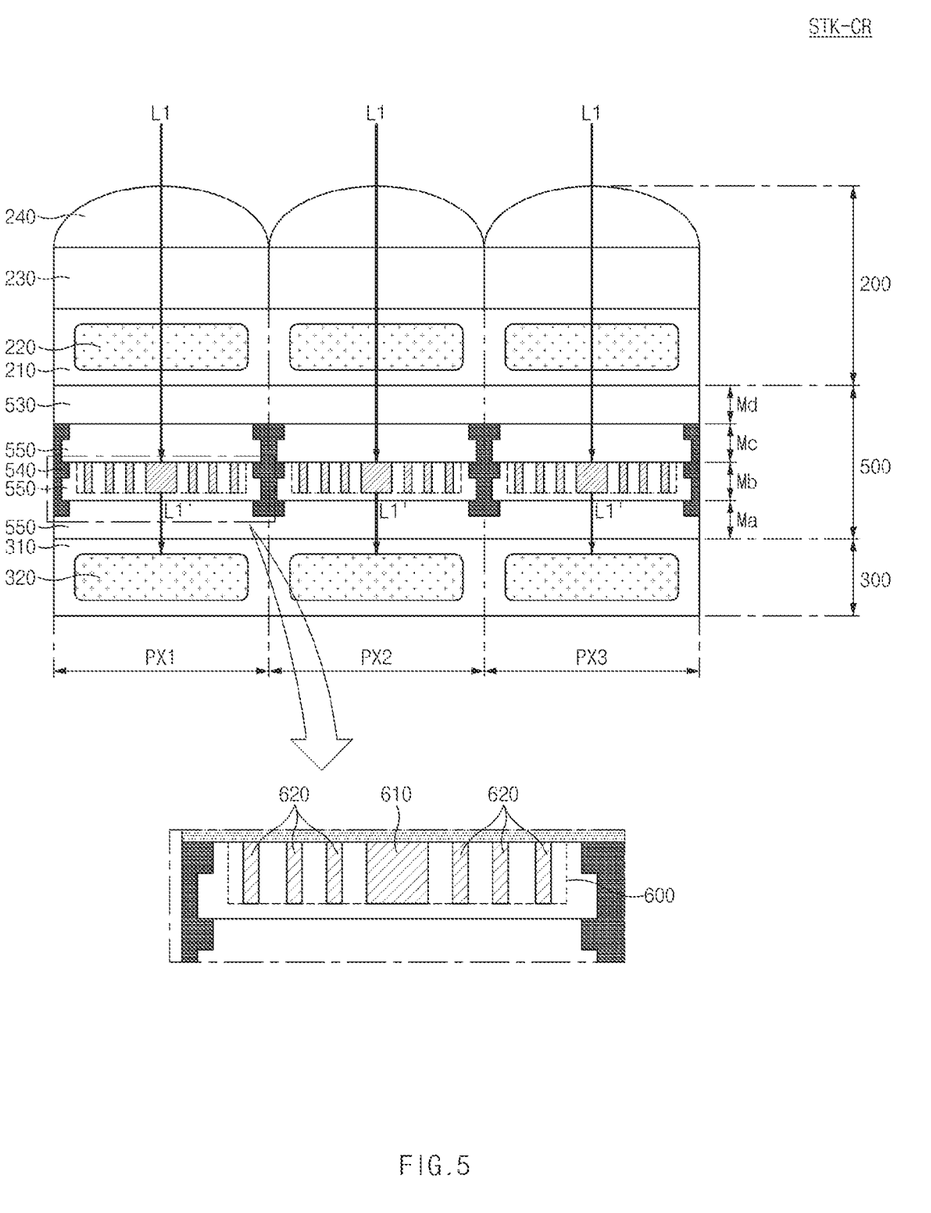
FIG. 5 is a diagram illustrating an example of the stacked structure corresponding to a center region of FIG. 4.

FIG. 5 is a diagram illustrating an example of the stacked structure corresponding to the center region of FIG. 4.

In some implementations, the stacked structure STK-CR may include the first sensor layer 200, the second sensor layer 300 and the bonding layer 500 in the center region CR. By way of example, FIG. 5 illustrates cross-sections of three adjacent pixels of the first sensor layer 200 and three adjacent pixels of the second sensor layer 300. In some implementations, the other pixels within the center region CR may have the same structure as the pixels illustrated. FIG. 5 illustrates first to third pixel groups PX1 to PX3, and each of the pixel groups PX1 to PX3 may include the pixels of the first and second sensor layers 200 and 300. The pixels include photoelectric conversion elements vertically overlap each other. Suppose that the center axis of the first pixel group PX1, a straight line that is parallel to the optical axis OA passing through the center of the photoelectric conversion element 220 within the pixel of the first sensor layer 200 included in the first pixel group PX1, a straight line that is parallel to the optical axis OA passing through the center of the photoelectric conversion element 320 within the pixel of the second sensor layer 300 included in the first pixel group PX1, and a straight line that is parallel to the optical axis OA passing through the center of a digital lens 600 coincide with one another. Such a supposition may be similarly applied to the other pixel groups which will be described below. Furthermore, the center axis of a pixel group is defined as a pixel center line.

In some implementations, the internal structures of the first and second sensor layers 200 and 300 are the same as those discussed above with reference to FIG. 3.

The bonding layer 500 may include the plurality of interconnect layers Ma to Md. The plurality of interconnect layers Ma to Md may be included in the interconnect region 510 described with reference to FIG. 3.

The first interconnect layer Ma, the second interconnect layer Mb, the third interconnect layer Mc and the fourth interconnect layer Md may be sequentially stacked from bottom to top in FIG. 5. During a fabrication process of the bonding layer 500, the plurality of interconnect layers Ma to Md may be stacked in the order of the fourth to first interconnect layers Md to Ma or the first to fourth interconnect layers Ma to Md in FIG. 5.

The bonding layer 500 may include pixel gates, metal interconnects 540, a dielectric layer 550 and the digital lens 600.

The pixel gates may be disposed in the interconnect layer Md adjacent to the bottom surface of the first substrate 210 or the interconnect layer Ma adjacent to the top surface of the second substrate 310. The metal interconnects 540 may be disposed in the interconnect layers Ma to Md, respectively, and metal interconnects included in different interconnect layers may be electrically coupled to each other through the dielectric layer 550. Since the pixel gates and the metal interconnects 540 have been described with reference to FIG. 3, the overlapping descriptions thereof will be omitted herein.

The dielectric layer 550 may surround the metal interconnects 540, electrically insulating the metal interconnects 540. In some implementations, the dielectric layer 550 may include at least one of silicon oxide, silicon nitride and silicon oxynitride.

Where the first sensor layer 200 structured to generate the color image is arranged over the second sensor layer 300 structured to generate the depth image, the disclosed technology can be implemented in some embodiments to provide a lens layer arranged below the first sensor layer 200 and above the second sensor layer 300 to modify the paths of light transmitted to the second sensor layer 300. The digital lens 600 may calibrate an optical path of the light transmitted through the first sensor layer 200 to increase the amount of light rays that reach the second sensor layer 300. The operation of calibrating the optical path may indicate an operation of refracting light such that an angle of incidence with respect to the digital lens 600 is larger than a refraction angle.

The digital lens 600 may include one or more first slits 610 having a relatively large width and one or more second slits 620 having a relatively small width. Furthermore, the digital lens 600 may include the dielectric layer 550 disposed to surround the first and second slits 610 and 620 and at portions of the digital lens 600 where the first or second slit 610 or 620 is not disposed. The number of first slits 610 and the number of second slits 620 in FIG. 5 are only examples for illustration purposes, and the disclosed technology is not limited thereto.

In an implementation, the digital lens 600 may be disposed in the second interconnect layer Mb. In another implementation, the digital lens 600 may be disposed in another interconnect layer such as the third interconnect layer Mc.

The first and second slits 610 and 620 may each include a material having a higher refractive index than the dielectric layer 550. The first and second slits 610/620 and the dielectric layer 550 in the digital lens 600 may be arranged such that the cross sections of the slits and the cross sections of the dielectric layer 550 are alternately arranged. Although not illustrated, a horizontal cross section of the digital lens 600 may have loop-shaped dielectric layers 550 and the second slits 620 that are alternately disposed around the first slit 610.

In some implementations, the digital lens 600 may be formed as will be discussed below. A photomask is disposed to define regions where the first and second slits 610 and 620 will be formed, after the dielectric layer 550 of the second interconnect layer Mb is formed. An etching process may be performed to form vacant patterns corresponding to the first and second slits 610 and 620. The vacant pattern may be gap-filled with a material having a relatively high refractive index, thereby forming the digital lens 600.

The region where the first slit 610 having a relatively large width is disposed in the digital lens 600 may become an optically dense region, and the region where the second slit 620 having a relatively small width is disposed in the digital lens 600 may become an optically less dense region. The dielectric layer 550 disposed in the interconnect layers Mc and Md over the digital lens 600 may become an optically less dense region, compared to the region where the second slit 620 is disposed in the digital lens 600. That is, the refractive indices of media may increase in the order of (1) the dielectric layer 550 disposed in the interconnect layers Mc and Md, (2) the region where the second slit 620 is disposed in the digital lens 600, and (3) the region where the first slit 610 is disposed in the digital lens 600.

Therefore, when light is incident on the digital lens 600 from the dielectric layer 550 disposed in the interconnect layers Mc and Md, the light propagates from the optically less dense region to the optically dense region. Thus, the refraction angle of the light is smaller than the angle of incidence thereof. Furthermore, since the region where the first slit 610 is disposed in the digital lens 600 corresponds to a denser medium than the region where the second slit 620 is disposed in the digital lens 600, the region where the first slit 610 is disposed has a smaller refraction angle than the region where the second slit 620 is disposed.

A chief ray L1 incident on each of the first to third pixel groups PX1 to PX3 included in the center region CR may enter the top surface of the first substrate 210 in the direction perpendicular to the top surface of the first substrate 210 and pass through the pixel center line of each of the pixel groups PX1 to PX3. Furthermore, the chief ray L1 may pass through the first slit 610 of the digital lens 600. That is, the first slit 610 may be disposed at a position of the digital lens 600 that the chief ray L1 reaches.

Since the angle of incidence of the chief ray L1 is 0 degree (or a value approximate to 0 degree), a chief ray L1' having passed through the digital lens 600 may reach the second photoelectric conversion element 320 while having a refraction angle of 0 degree (or a value approximate to 0 degree).

Figure 6:
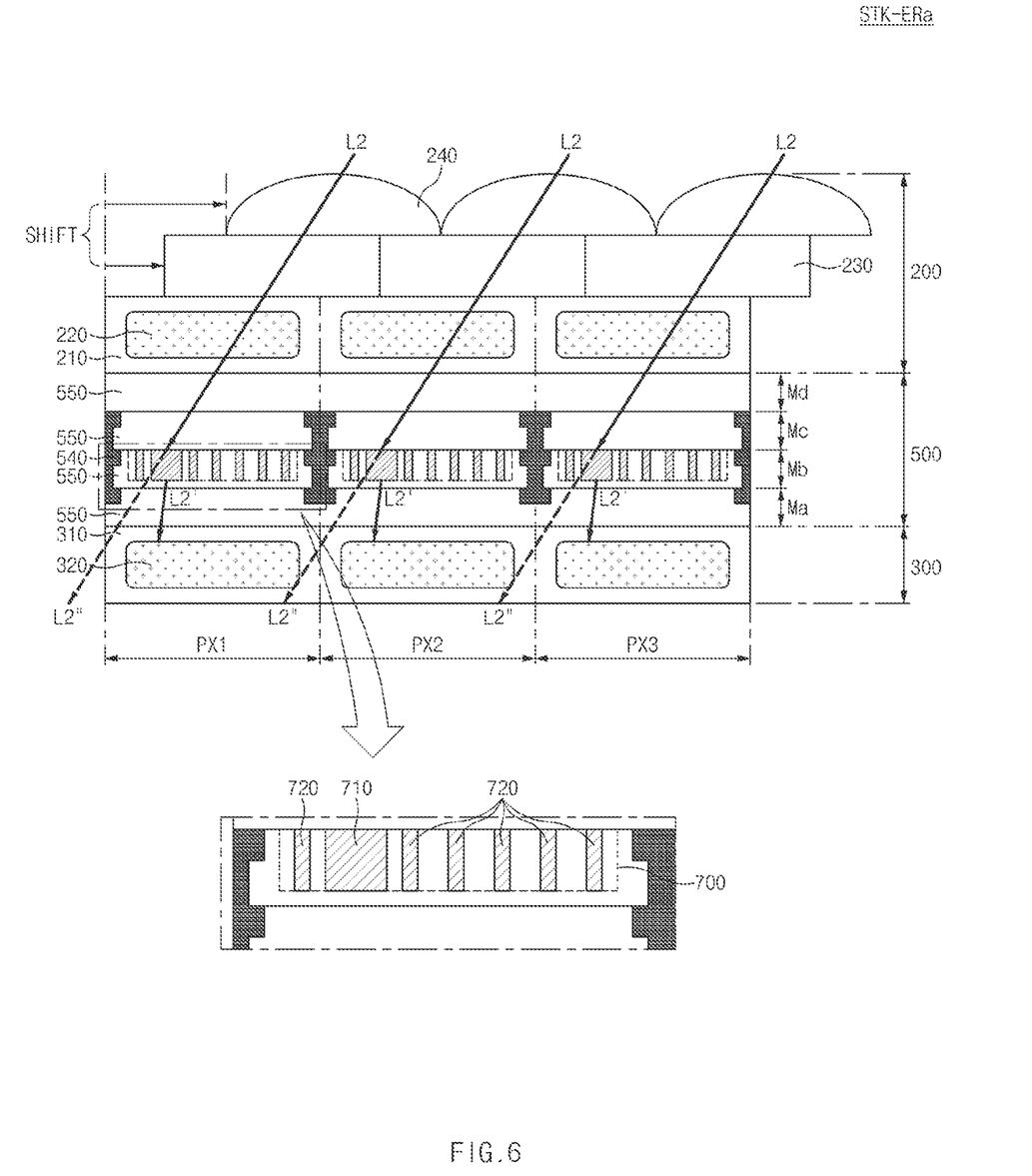
FIG. 6 is a diagram illustrating an example of the stacked structure corresponding to a first edge region of FIG. 4.

FIG. 6 is a diagram illustrating an example of the stacked structure corresponding to a first edge region of FIG. 4.

In some implementations, the stacked structure STK-ERa may include the first sensor layer 200, the second sensor layer 300 and the bonding layer 500 in the first edge region ER1. By way of example, FIG. 6 illustrates cross-sections of the first to third pixel groups PX1 to PX3 including three adjacent pixels of the first sensor layer 200 and three adjacent pixels of the second sensor layer. In some implementations, the other pixels within the first edge region ER1 may have the same structure as the pixels illustrated. In some implementations, the structure of the second edge region ER2 and the structure of the first edge region ER1 are symmetrical with respect to the optical axis OA, and thus the structure of the second edge region ER2 may have the same structure as the first edge region ER1.

In the first edge region ER1, the optical filter 230 and the microlens 240 may be shifted to the right from the first photoelectric conversion element 220. That is, the optical filter 230 and the microlens 240 may be shifted toward the optical axis OA from the pixel center line. The optical filter 230 and the microlens 240 may be shifted to different extents. As illustrated in FIG. 6, the microlens 240 may be shifted more than the optical filter 230 to effectively perform light collection and filtering on a chief ray L2 incident on the first to third pixel groups PX1 to PX3 in the first edge region ER1, because the chief ray L2 is incident obliquely with respect to the top surface of the first substrate 210.

In some implementations, the inner structure of the bonding layer 500 is identical or similar to what is discussed above with reference to FIG. 5, the following descriptions will focus on what is different from the bonding layer 500 of FIG. 5.

The chief ray L2 incident on each of the first to third pixel groups PX1 to PX3 included in the first edge region ER1 may be incident obliquely with respect to the top surface of the first substrate 210, and incident toward the left side based on the pixel center line of each of the pixel groups PX1 to PX3. A first slit 710 of a digital lens 700 may be shifted to the left from the pixel center line of each of the pixel groups PX1 to PX3, and disposed at a position of the digital lens 700 that the chief ray L2 reaches. That is, the first slit 710 may be shifted in the opposite direction to the optical axis OA from the center of the digital lens 700.

In an embodiment, the position of the first slit 710 within the digital lens 700 at the first edge region ER1 may vary, and the first slit 710 may be shifted further as the distance to the optical axis OA increases.

The first slit 710 of the digital lens 700 may refract the chief ray L2 at a smaller refraction angle than the angle of incidence of the chief ray L2.

When the chief ray L2 has a first angle of incidence, a chief ray L2' having passed through the digital lens 700 may reach the second photoelectric conversion element 320 while having a smaller refraction angle than the first angle of incidence.

Furthermore, light rays other than the chief ray L2 incident on a second slit 720 of the digital lens 700 may also be transferred to the second photoelectric conversion element 320 while having a smaller refraction angle than the corresponding angle of incidence.

When it is assumed that the digital lens 700 is not present in the second pixel group PX2, the chief ray L2 incident on the second pixel group PX2 is not refracted toward the photoelectric conversion element 320 of the second pixel group PX2, but is incident on the photoelectric conversion element 320 of the first pixel group PX1 like a chief ray L2", thereby causing optical crosstalk to degrade a signal-to-noise ratio.

Figure 7:
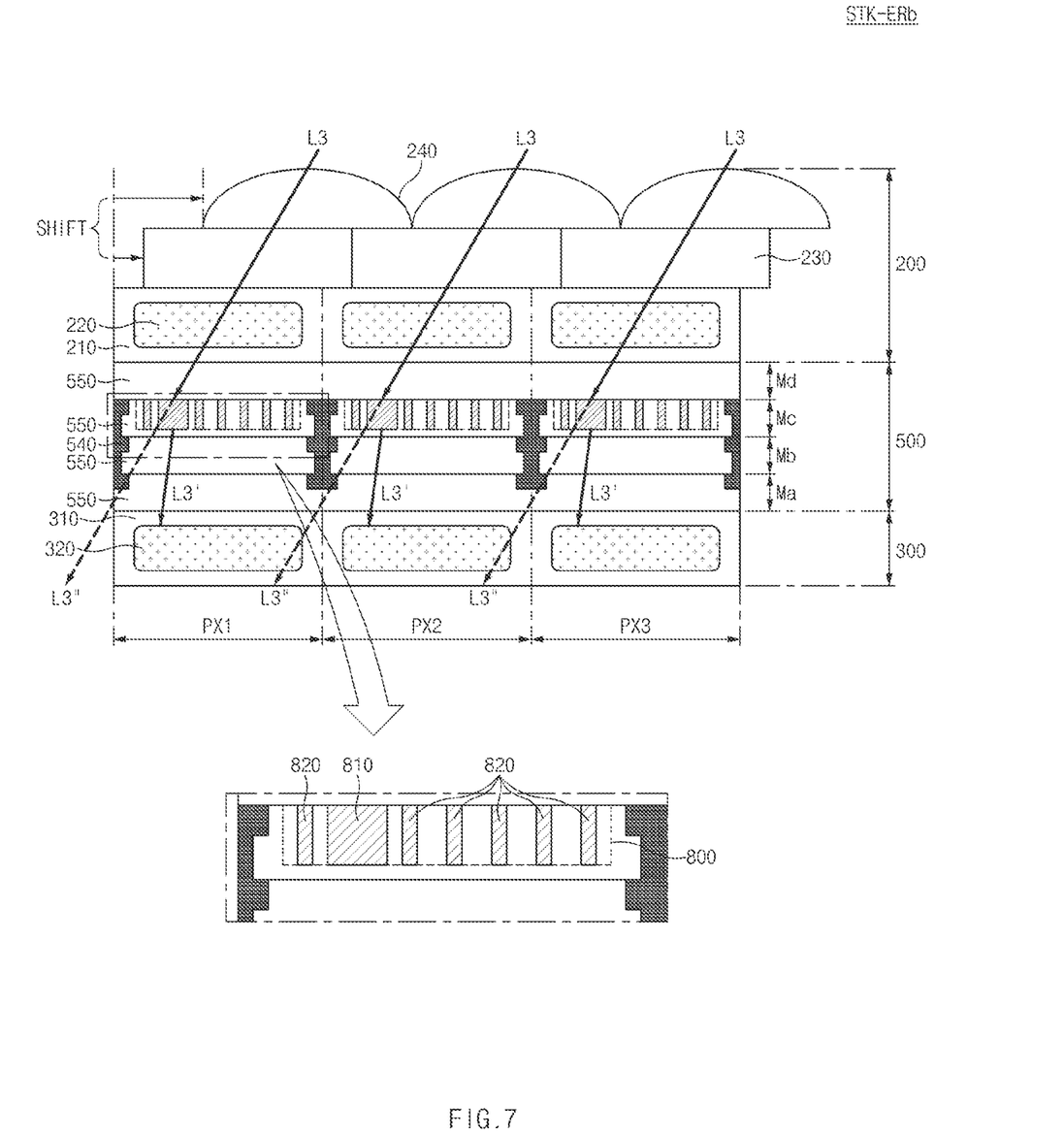
FIG. 7 is a diagram illustrating another example of the stacked structure corresponding to the first edge region of FIG. 4.

FIG. 7 is a diagram illustrating another example of the stacked structure corresponding to the first edge region of FIG. 4.

In some implementations, the stacked structure STK-ERb may include the first sensor layer 200, the second sensor layer 300 and the bonding layer 500 in the first edge region ER1. By way of example, FIG. 7 illustrates cross-sections of the first to third pixel groups PX1 to PX3 including three adjacent pixels of the first sensor layer 200 and three adjacent pixels of the second sensor layer 300. In some implementations, the other pixels within the first edge region ER1 may have the same structure as the pixels illustrated. In some implementations, the structure of the second edge region ER2 and the structure of the first edge region ER1 are symmetrical with respect to the optical axis OA, and thus the structure of the second edge region ER2 may have the same structure as the first edge region ER1.

In some implementations, the stacked structure illustrated in FIG. 7 is identical or similar to what is discussed above with reference to FIG. 6, the following descriptions will focus on what is different from FIG. 6.

A digital lens 800 may have substantially the same internal structure as the digital lens 700 of FIG. 6. However, the digital lens 800 may be disposed in the third interconnect layer Mc located over the second interconnect layer Mb.

A chief ray L3 incident on each of the first to third pixel groups PX1 to PX3 included in the first edge region ER1 may have a relatively large second angle of incidence. In this case, as the chief ray L3 significantly deviates from the pixel center line before reaching the second interconnect layer Mb, the refraction of light rays by the digital lens 800 may not be effectively performed.

However, the digital lens 800 disposed in the third interconnect layer Mc located over the second interconnect layer Mb may effectively perform a refracting operation on the chief ray L3 before the chief ray L3 significantly deviates from the pixel center line, thereby transferring a chief ray L3' having passed through the digital lens 800 to the second photoelectric conversion element 320.

When it is assumed that the digital lens 800 is not present in the second pixel group PX2, the chief ray L3 incident on the second pixel group PX2 is not refracted toward the photoelectric conversion element 320 of the second pixel group PX2, but is incident on the photoelectric conversion element 320 of the first pixel group PX1 like a chief ray L3", thereby causing optical crosstalk to degrade a signal-to-noise ratio.

Figure 8:
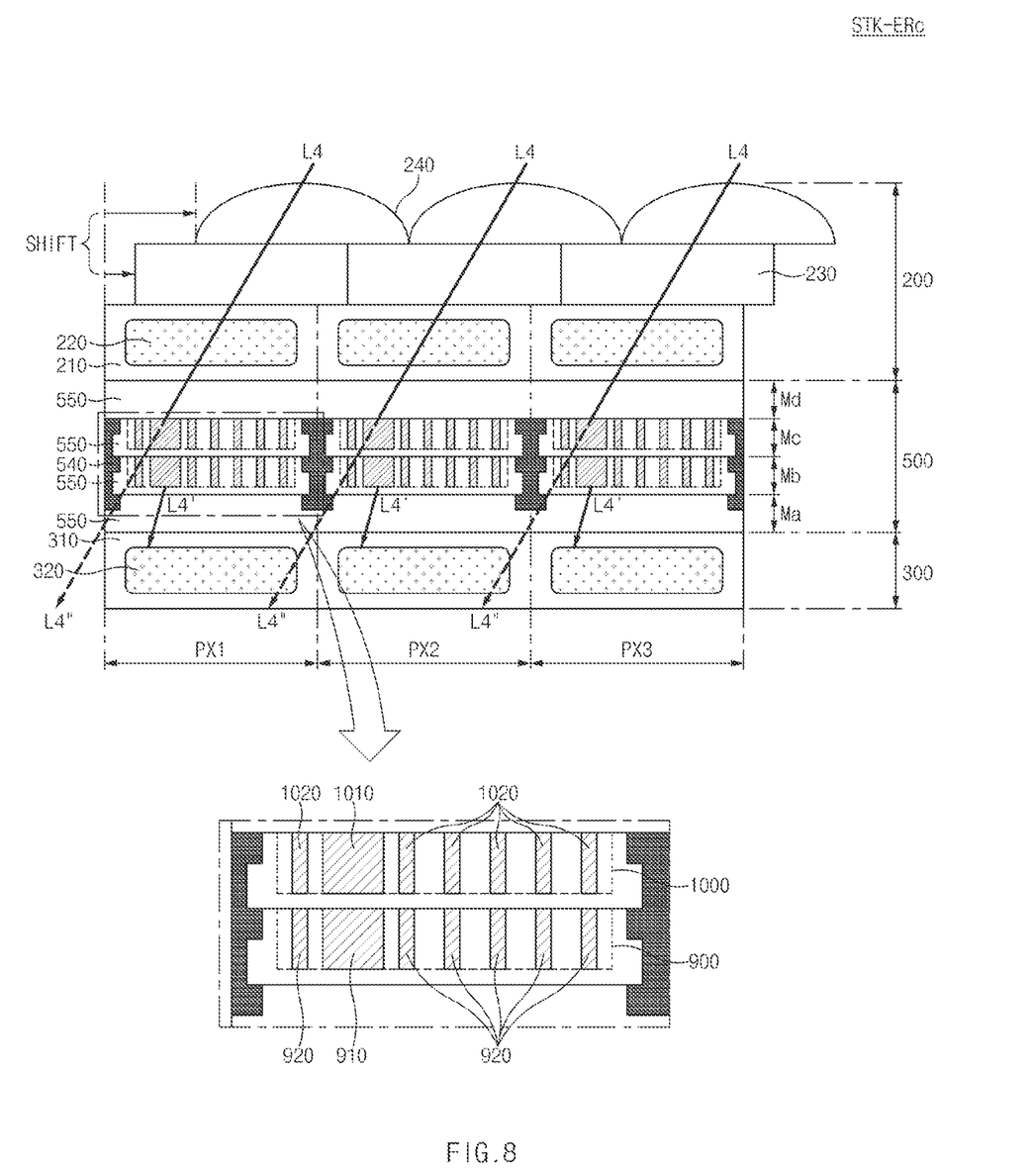
FIG. 8 is a diagram illustrating another example of the stacked structure corresponding to the first edge region of FIG. 4.

FIG. 8 is a diagram illustrating another example of the stacked structure corresponding to the first edge region of FIG. 4.

In some implementations, the stacked structure STK-ERc may include the first sensor layer 200, the second sensor layer 300 and the bonding layer 500 in the first edge region ER1. By way of example, FIG. 8 illustrates cross-sections of the first to third pixel groups PX1 to PX3 including three adjacent pixels of the first sensor layer 200 and three adjacent pixels of the second sensor layer 300. In some implementations, the other pixels within the first edge region ER1 may have the same structure as the pixels illustrated. In some implementations, the structure of the second edge region ER2 and the structure of the first edge region ER1 are symmetrical with respect to the optical axis OA, and thus the structure of the second edge region ER2 may have the same structure as the first edge region ER1.

In some implementations, the stacked structure illustrated in FIG. 8 is identical or similar to what is discussed above with reference to FIG. 6, the following descriptions will focus on what is different from FIG. 6.

Digital lenses 900 and 1000 may have substantially the same internal structure as the digital lens 700 of FIG. 6. However, the digital lens 900 may be disposed in the second interconnect layer Mb, and the digital lens 1000 may be disposed in the third interconnect layer Mc. That is, the plurality of digital lenses 900 and 1000 may be stacked in each of the pixel groups PX1 to PX3. FIG. 8 illustrates two digital lenses that are stacked as an example. However, three or more digital lenses may be stacked.

A chief ray L4 incident on each of the first to third pixel groups PX1 to PX3 included in the first edge region ER1 may have a relatively large third angle of incidence. In this case, the chief ray L4 may not be refracted to have a sufficiently small refraction angle even though the chief ray L4 passes through one digital lens. Thus, the chief ray L4 may not be transferred to the second photoelectric conversion element 320.

However, the plurality of digital lenses 900 and 1000 disposed in the second and third interconnect layers Mb and Mc, respectively, may be refracted twice to sufficiently reduce the refraction angle of a chief ray L4' having passed through the digital lenses 900 and 1000. Thus, the chief ray L4' may be stably transferred to the second photoelectric conversion element 320.

In an embodiment, in order to maximize the refraction effect by the plurality of digital lenses 900 and 1000, the distance between a first slit 1010 of the digital lens 1000 and the pixel center line may be smaller than the distance between a first slit 910 of the digital lens 900 and the pixel center line to allow the chief ray L4' to more reliably pass through the first slits 910 and 1010 of the digital lenses 900 and 1000.

When it is assumed that the digital lens 900 and 1000 are not present in the second pixel group PX2, the chief ray L4 incident on the second pixel group PX2 is not refracted toward the photoelectric conversion element 320 of the second pixel group PX2, but is incident on the photoelectric conversion element 320 of the first pixel group PX1 like a chief ray L4'', thereby causing optical crosstalk to degrade a signal-to-noise ratio.

The embodiments of the digital lens, described with reference to FIGS. 6 to 8, may be combined, if necessary.

For example, the digital lens 700 of FIG. 6 may be disposed in the second interconnect layer Mb at a region within the first edge region E1, which is relatively close to the center region CR. The digital lens 800 may be disposed in the third interconnect layer Mc at a region which is relatively far from the center region CR, as illustrated in FIG. 7, and a digital lens may be disposed in the fourth interconnect layer Md at a region which is the farthest from the center region CR. Alternatively, as illustrated in FIG. 8, the digital lenses 900 and 1000 may be disposed in the second and third interconnect layers Mb and Mc, respectively.

While various embodiments have been described above as specific examples for implementing those embodiments, variations and modifications of those embodiments and other embodiments can be made based on what is disclosed and illustrated in this patent document.

What is claimed is:

1. An image sensing device comprising:
   a first sensor layer structured to include a plurality of first photoelectric conversion elements to receive light rays and generate photocharge corresponding to the light rays;
   a second sensor layer disposed below the first sensor layer, the second sensor layer structured to include a plurality of second photoelectric conversion elements vertically overlapping the first photoelectric conversion elements to receive light rays and generate photocharge corresponding to the light rays having passed through the first sensor layer; and
   a bonding layer disposed between the first and second sensor layers,
   wherein the bonding layer comprises a lens layer structured to refract light rays having passed through the first sensor layer toward the second sensor layer such that an angle of incidence of the light rays is larger than a refraction angle of the light rays,
   wherein the lens layer includes a digital lens that comprises a first slit having a first width, a second slit having a second width that is narrower than the first width, and a dielectric layer structured to surround the first and second slits.

2. The image sensing device of claim 1, wherein each of the first and second slits has a higher refractive index than the dielectric layer.

3. The image sensing device of claim 1, wherein the first slit is disposed at a position where a chief ray incident on the digital lens reaches.

4. The image sensing device of claim 1, wherein the first sensor layer, the second sensor layer and the bonding layer are divided into a center region, through which an optical axis of a lens module for transferring light to the first photoelectric conversion elements passes, and an edge region surrounding the center region, and
   the digital lens at the center region is disposed in a first interconnect layer of the bonding layer.

5. The image sensing device of claim 4, wherein the first slit in the edge region is shifted in the opposite direction to the optical axis from the center of the digital lens.

6. The image sensing device of claim 4, wherein the digital lens in the edge region is disposed in a second interconnect layer of the bonding layer, and
   wherein the second interconnect layer is disposed over the first interconnect layer.

7. The image sensing device of claim 4, wherein the digital lens in the edge region is disposed in each of the first interconnect layer of the bonding layer and a second interconnect layer disposed over the first interconnect layer.

8. The image sensing device of claim 4, wherein a microlens disposed over the first photoelectric conversion element in the edge region is shifted toward the optical axis from the center of the digital lens.

9. The image sensing device of claim 1, further comprising a logic layer that includes circuitry configured to process electrical signals corresponding to photocharges converted from the light rays by the first and second photoelectric conversion elements.

10. The image sensing device of claim 9, wherein the logic layer is disposed under the second sensor layer, and
the bonding layer and the logic layer are electrically coupled through a Through Silicon Via (TSV) formed through the second sensor layer.

11. An image sensing device comprising:
a plurality of first photoelectric conversion elements structured to respond to incident light, each first photoelectric conversion element structured to convert the incident light into a first electrical signal;
a plurality of second photoelectric conversion elements disposed under the plurality of first photoelectric conversion elements vertically overlapping the plurality of first photoelectric conversion elements, each second photoelectric conversion element structured to convert the incident light that passes through a first sensor layer into a second electrical signal; and
a lens layer disposed under the plurality of first photoelectric conversion elements and over the plurality of second photoelectric conversion elements,
wherein the lens layer comprises a first slit having a first width, a second slit having a second width narrower than the first width, and a dielectric layer structured to surround the first and second slits, and the first slit is disposed at a position where a chief ray incident on the lens layer reaches.

12. The image sensing device of claim 11, wherein each of the first and second slits has a higher refractive index than the dielectric layer.

13. The image sensing device of claim 11, wherein the plurality of first photoelectric conversion elements are formed in the first sensor layer, the plurality of second photoelectric conversion elements are formed in a second sensor layer, and the lens layer is formed in a bonding layer structured to bond the first sensor layer to the second sensor layer, and wherein the first sensor layer, the second sensor layer, and the bonding layer are divided into a center region, through which an optical axis of a lens module for transferring light to the first photoelectric conversion elements passes, and an edge region surrounding the center region, and
the lens layer at the center region is disposed in a first interconnect layer of the bonding layer.

14. The image sensing device of claim 13, wherein the first slit in the edge region is shifted in the opposite direction to the optical axis from the center of the lens layer.

15. The image sensing device of claim 13, wherein the lens layer in the edge region is disposed in a second interconnect layer of the bonding layer, and
wherein the second interconnect layer is disposed over the first interconnect layer.

16. The image sensing device of claim 13, wherein the lens layer in the edge region is disposed in each of the first interconnect layer of the bonding layer and a second interconnect layer disposed over the first interconnect layer.

* * * * *